(12) United States Patent
Yin et al.

(10) Patent No.: US 8,389,922 B2
(45) Date of Patent: Mar. 5, 2013

(54) SENSING DEVICES AND MANUFACTURING METHODS THEREFOR

(75) Inventors: Ping-Hung Yin, Grand Cayman (KY); Shuenn-Ren Hsiao, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 367 days.

(21) Appl. No.: 12/850,090

(22) Filed: Aug. 4, 2010

(65) Prior Publication Data
US 2012/0032066 A1 Feb. 9, 2012

(51) Int. Cl.
*H01L 27/00* (2006.01)

(52) U.S. Cl. .................. 250/208.1; 250/214.1; 257/448; 257/E27.131

(58) Field of Classification Search ............... 250/208.1, 250/214.1; 257/447, 448, 460, 465, E27.131, 257/E27.132
See application file for complete search history.

(56) References Cited

U.S. PATENT DOCUMENTS 8,228,304 B2 * 7/2012 Morrison et al. ............. 345/173
2011/0285880 A1 * 11/2011 Brady ........................... 348/273

FOREIGN PATENT DOCUMENTS

WO    WO 2006129762 A1 * 12/2006

* cited by examiner

*Primary Examiner* — Kevin Pyo
(74) *Attorney, Agent, or Firm* — McClure, Qualey & Rodack, LLP

(57) ABSTRACT

A sensing device is provided. The sensing device includes a sensing pixel array and a memory unit. The sensing pixel array is formed in a substrate and includes a plurality of pixels for sensing light. The substrate has a first side and a second side opposite to the first side and receives the light through the first side for sensing the light. The memory unit is formed on the second side of the substrate for memorization.

12 Claims, 4 Drawing Sheets

SENSING DEVICES AND MANUFACTURING METHODS THEREFOR

BACKGROUND OF THE INVENTION

1. Field of the Invention

The invention relates to a sensing device, and more particularly to a sensing device with back-side illumination which comprises a memory unit disposed on the front side of a sensing pixel array.

2. Description of the Related Art

Conventional image sensors comprises several elements that are key to enhance performance of the image sensors (e.g. CMOS image sensor, CIS), such as color filters, a sensing pixel array which converts light into electrical signals, circuits which receive electrical signals, convert electrical signals to digital signals, and then process the digital signals, and etc. CIS technology is advantageous in that it may be used to integrate all of the above mentioned elements on a single die or chip.

FIG. 1 shows a cross section of a conventional CMOS image sensor with front-side illumination (FSI). Referring to FIG. 1, a CMOS image sensor 1 comprises a pixel array 10 composed of pixels 100, a plurality of metal layers 11 forming CMOS circuits, a color filter 12, and a microlens 13. The metal layers 11 are formed on the pixel array 10 for interconnections. The color filter 12 is formed on the metal layers 11. The CMOS image sensor 1 receives light 14 through the microlens 13, and the received light is transmitted to the pixel array 10 through the color filter 12 and the metal layers 11. Since the CMOS image sensor 1 with front-side illumination requires several light sensing regions which are not blocked by metal lines in the metal layers 11 for a greater aperture ratio, severe restrictions are made at the metal lines connecting the in-pixel circuitry to the peripheral circuitry. These limitations to the metal line interconnection between the pixels 100 and the periphery circuitry limit the maximum bandwidth available for pixel-to-periphery communications. Accordingly, parameters, such as maximum frame rate, dynamic range, etc. of the CMOS image sensor are worsened. Moreover, when the size of the pixels 100 becomes smaller, the performance of the pixel array 10 including quantum efficiency (QE), cross-talk effect, and dark current is degraded.

Thus, back-side illumination (BSI) for CMOS image sensors has been disclosed. FIG. 2 shows a cross section of a conventional CMOS image sensor with back-side illumination. Referring to FIG. 2, a CMOS image sensor 2 comprises a pixel array 20 composed of pixels 200, a plurality of metal layers 21 forming CMOS circuits, a color filter 22, and a microlens 23. The pixel array 20 receives light 24 through the microlens 23 and the color filter 22 and not through metal layers 21. The performance of the pixel array 200 is not hindered by light passing through the metal layers 21, as light passes through the microlens 23 and the color filter 22.

BRIEF SUMMARY OF THE INVENTION

An exemplary embodiment of a sensing device is provided. The sensing device comprises a sensing pixel array and a memory unit. The sensing pixel array is formed in a substrate and comprises a plurality of pixels for sensing light. The substrate has a first side and a second side opposite to the first side and receives the light through the first side for sensing the light. The memory unit is formed on the second side of the substrate for memorization.

In some embodiments, the memory unit comprises a first metal layer, a second metal layer, a plurality of first metal lines, and a plurality of second metal lines. The first and second metal layers are formed on the second side of the substrate. The memory unit is formed in the first and second metal layers. The first metal lines are formed in the first metal layer. The second metal lines are formed in the second metal layer and interlaced with the first metal lines. Each set of the interlaced first and second metal lines forms a cell for memorization. When data has been written into one cell for memorization, the first metal line corresponding to the cell is connected to a corresponding second metal line through a via, and, thus, the voltage levels of the first and second metal lines are equal.

An exemplary embodiment of a manufacturing method for a sensing device is provided. The manufacturing method comprises the steps of providing a substrate, forming a sensing pixel array in the substrate, wherein the substrate has a first side and a second side opposite to the first side, and the sensing pixel array receives the light through the first side for sensing the light; and forming a memory unit on the second side of the substrate for memorization.

In some embodiments, the step of forming the memory unit comprises: forming a first metal layer and a second metal layer on the second side of the substrate; forming a plurality of first metal lines in the first metal layer; and forming a plurality of second metal lines in the second metal layer. The second metal lines are interlaced with the first metal lines, and each set of the interlaced first and second metal lines forms a cell for memorization. Moreover, data is written into one cell for memorization by connecting a corresponding first metal line to a corresponding second metal line through a via.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
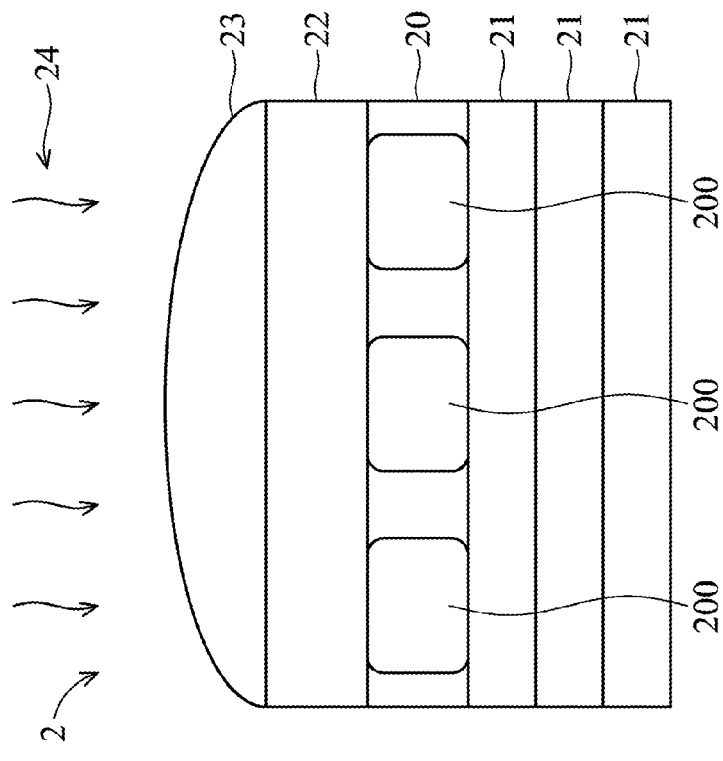
FIG. 1 is a cross section of a conventional CMOS image sensor with front-side illumination.
Figure 2:
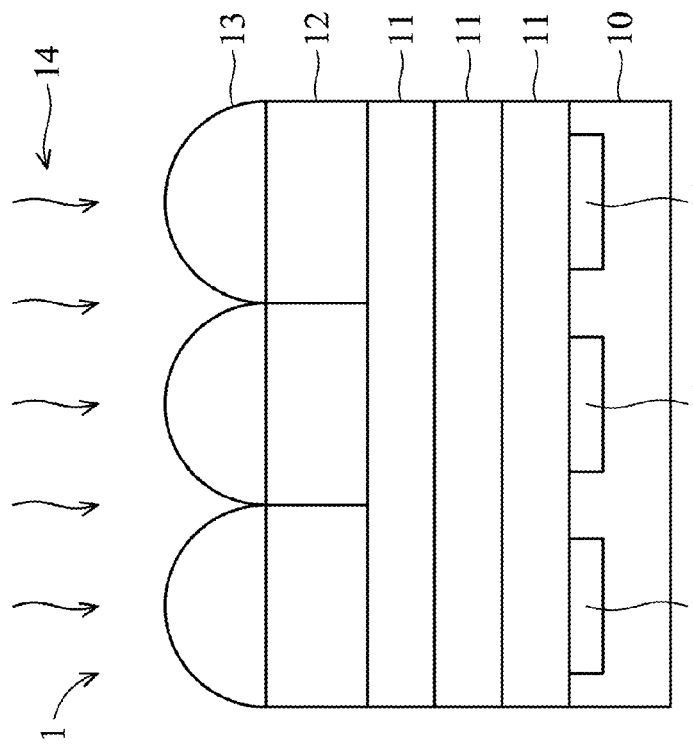
FIG. 2 is a cross section of a conventional CMOS image sensor with back-side illumination.
Figure 3:
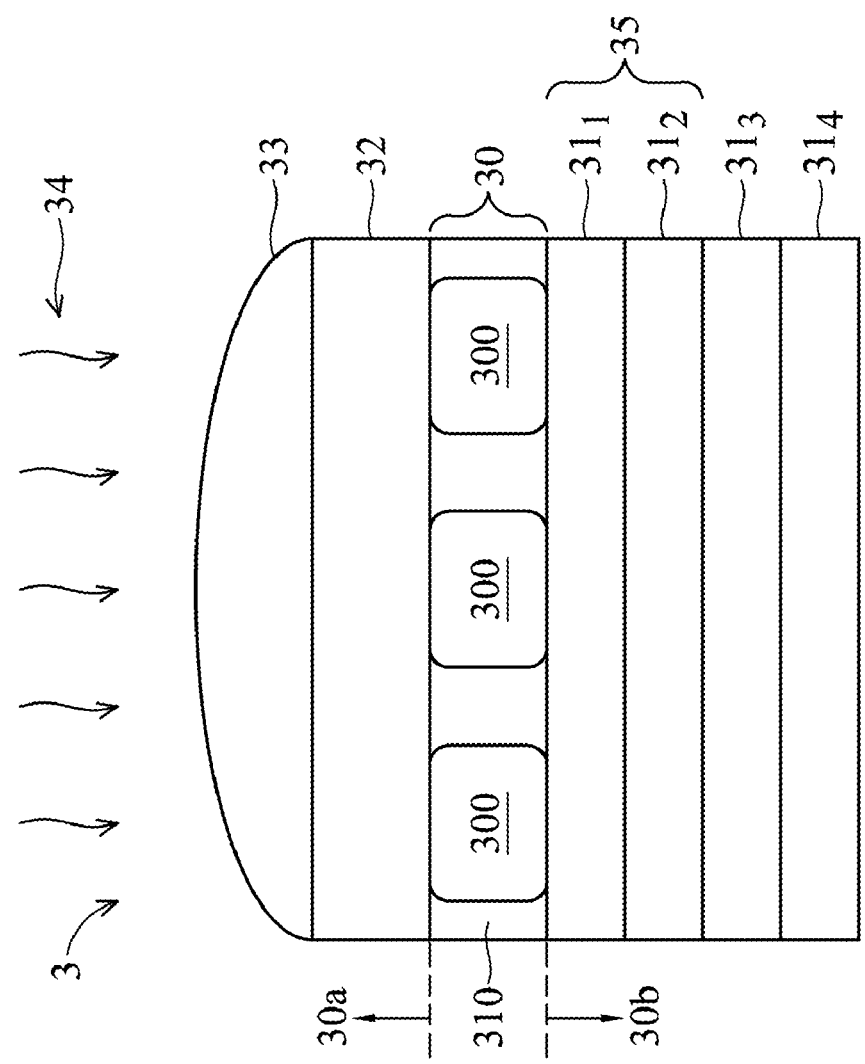
FIG. 3 is a cross section of an exemplary embodiment of a sensing device.

FIG. 3 is a cross section of an exemplary embodiment of a sensing device. Referring to FIG. 3, a sensing device 3 comprises a pixel array 30, a plurality of metal layers 31, a color filter 32, and a microlens 33. The pixel array 30 is formed in a substrate 310 and comprises a plurality of pixels 300, which are disposed in rows and columns, for sensing light. The substrate 310 has a first side 30a and a second side 30b opposite to the first side 30a. In the embodiment, the sensing device 3 uses back-side illumination (BSI) techniques. Thus, the microlens 33 is formed on the first side 30a of the substrate 310, and the color filter 32 is formed between the microlens 33 and the sensing pixel array 30. In another example, the microlens 33 can be formed between the color filter 32 and the sensing pixel array 30. The metal layers 31 are formed on the second side 30b of the substrate 310. Accordingly, the sensing pixel array 30 receives light 34 passing through the microlens 33 and the color filter 32 on the first side 30a for sensing the light 34. Thus, the light 34 is not blocked by the metal layers 31 on the second side 30b.

Figure 4:
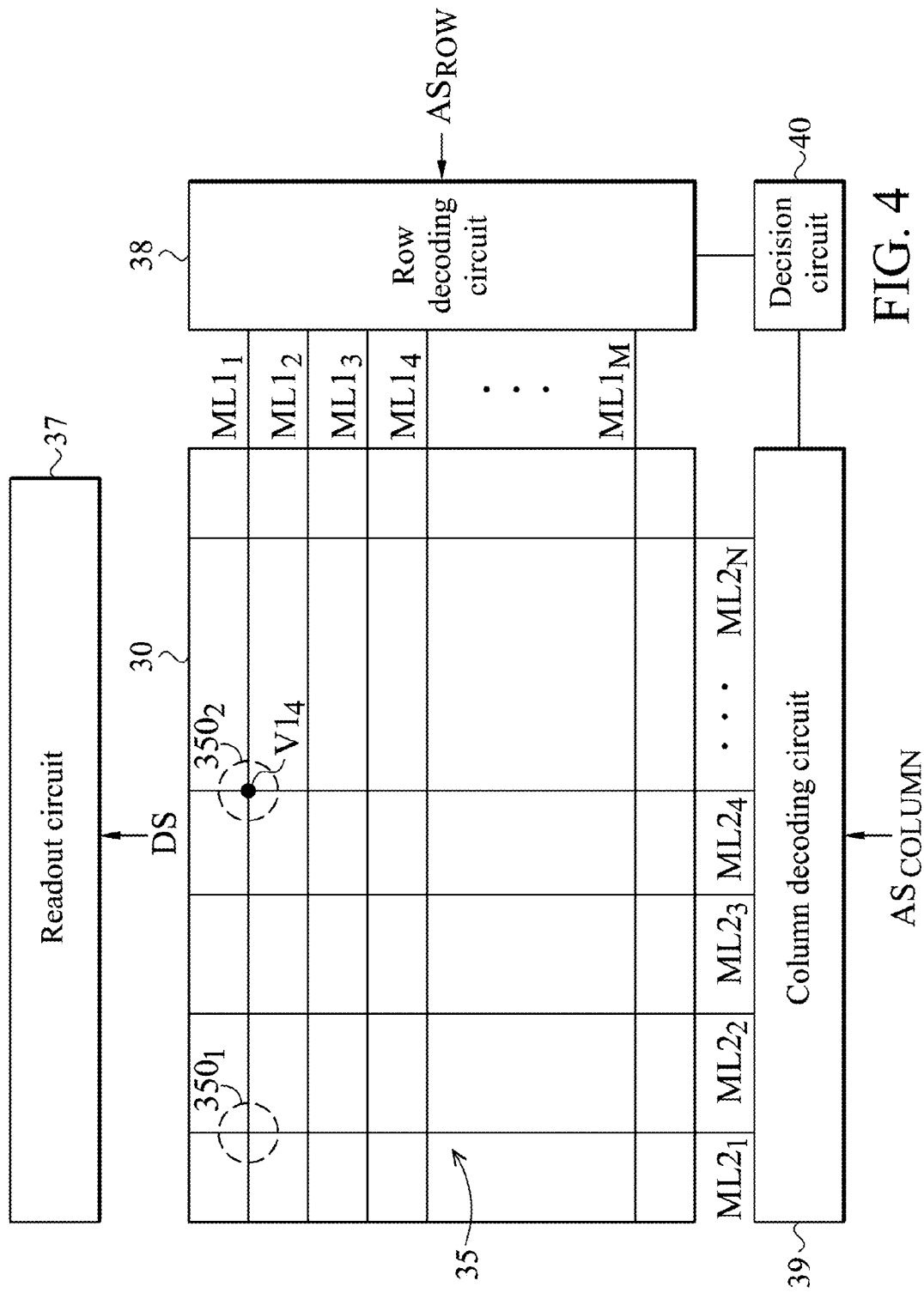
FIG. 4 is an upward view of the sensing device 3.

In the embodiment, four metal layers $31_1$~$31_4$ are given as an example. However, the number of metal layers may be determined according to requirements. Among the four metal layers $31_1$~$31_4$, two metal layers are used to form a memory unit. For example, as shown in FIG. 3, the metal layers $31_1$ and $31_2$ are used to form a memory unit 35 for memorization. In the embodiment, the memory unit 35 is implemented by a read-only memory (ROM). FIG. 4 is an upward view of the sensing device 3. For clear description, FIG. 4 only shows the sensing pixel array 30 and the memory unit 35 formed in the metal layers $31_1$ and $31_2$ in FIG. 3. Referring to FIG. 4, the memory unit 35 comprises a plurality of first metal lines $ML1_1$~$ML1_M$ formed in the metal layer $31_1$ and a plurality of second metal lines $ML2_1$~$ML2_N$ formed in the metal layer $31_2$, wherein M and N are positive integers. The first metal lines $ML1_1$~$ML1_M$ are interlaced with the second metal lines $ML2_1$~$ML2_N$. Accordingly, each set of the interlaced first and second metal lines forms a cell for memorization. For example, the interlaced first and second metal lines $ML1_1$ and $ML2_1$ form a cell $350_1$.

In some embodiments, the first metal lines $ML1_1$~$ML1_M$ are formed in the metal layer $31_2$ and the second metal lines $ML2_1$~$ML2_N$ are formed in the metal layer $31_1$.

Referring to FIG. 4, the sensing device 3 further comprises a readout circuit 37 and a memory control circuit. The memory control circuit includes a row decoding circuit 38, a column decoding circuit 39, and a decision circuit 40. As described above, the pixels 300 of the sensing pixel array 30 sense the light 34 passing through the microlens 33 and the color filter 32. The pixels 300 thus generate detection signals DS respectively according to the sensed light 34. The readout circuit 37 is used to read the detection signal DS which is generated from the at least one selected pixel.

In the embodiment, the memory unit 35 is an ROM for memorizing data. When data has been written into one cell for memorization, a corresponding first metal line in the metal layer $31_1$ is connected to a corresponding second metal line in the metal layer $31_2$ through a via. For example, when data has been written into the cell $350_2$ for memorization, the first metal line $ML1_1$ is connected to a second metal line $ML2_4$ through a via $V1_4$. The cell without a corresponding first metal line in the metal layer $31_1$ connected to a corresponding second metal line in the metal layer $31_2$ through a via does not memorize data.

The row decoding circuit 38 receives an address signal $AS_{ROW}$ and selects one of the first metal lines $ML1_1$~$ML1_M$ once, according to the address signal $AS_{ROW}$, to detect a voltage level of the selected first metal line. The column decoding circuit 39 receives an address signal $AS_{COLUMN}$ and selects one of the second metal lines $ML2_1$~$ML2_N$, according to the address signal $AS_{COLUMN}$, to detect a voltage level of the selected second metal line. The decision circuit 40 then determines whether the voltage level of the selected first metal line is equal to the voltage level of the selected second metal line. Assume that the row decoding circuit 38 has selected the first metal line $ML1_1$ according to the address signal $AS_{ROW}$ to detect the voltage level of the first metal line $ML1_1$, and the decoding circuit 39 has selected the second metal line $ML2_4$ to detect the voltage level of the second metal line $ML2_4$ according to the address signal $AS_{COLUMN}$. Since the first metal line $ML1_1$ is connected to the second metal line $ML2_4$ through the via $V1_4$ for data writing, the decision circuit 40 determines that the voltage level of the first metal line $ML1_1$ is equal to the voltage level of the second metal line $ML2_4$. Thus, the decision circuit 40 decides that data has been written into the cell $350_2$ for memorization and generates a corresponding value, such as a logic high value "1".

Assume that the row decoding circuit 38 has selected the first metal line $ML1_1$ according to the address signal $AS_{ROW}$ to detect the voltage level of the first metal line $ML1_1$, and the decoding circuit 39 has selected the second metal line $ML2_1$ to detect the voltage level of the second metal line $ML2_1$ according to the address signal $AS_{COLUMN}$. Since the first metal line $ML1_1$ is not connected to the second metal line $ML2_1$ through a via, the decision circuit 40 determines that the voltage level of the first metal line $ML1_1$ is not equal to the voltage level of the second metal line $ML2_1$. Thus, the decision circuit 40 decides that data is not written into the cell $350_1$ and generates a corresponding value, such as a logic low value "0".

According to the sensing device 3 of the embodiment, the sensing pixel array 30 receives the light 24 through the first side 30a of the substrate 310 for sensing the light 34, and the memory unit 35 formed in the metal layers $31_1$ and $31_2$ is disposed on the second side 30b opposite to the first side 30a. Thus, the light 34 is not blocked by the first metal lines $ML1_1$~$ML1_M$ in the metal layer $31_1$ and the second metal lines $ML2_1$~$L2_N$ in the metal layer $31_2$. Moreover, the further implemented memory unit 35 can memorize data, without degrading quantum efficiency (QE), cross-talk effect, and dark current of the sensing device 3.

Figure 5:
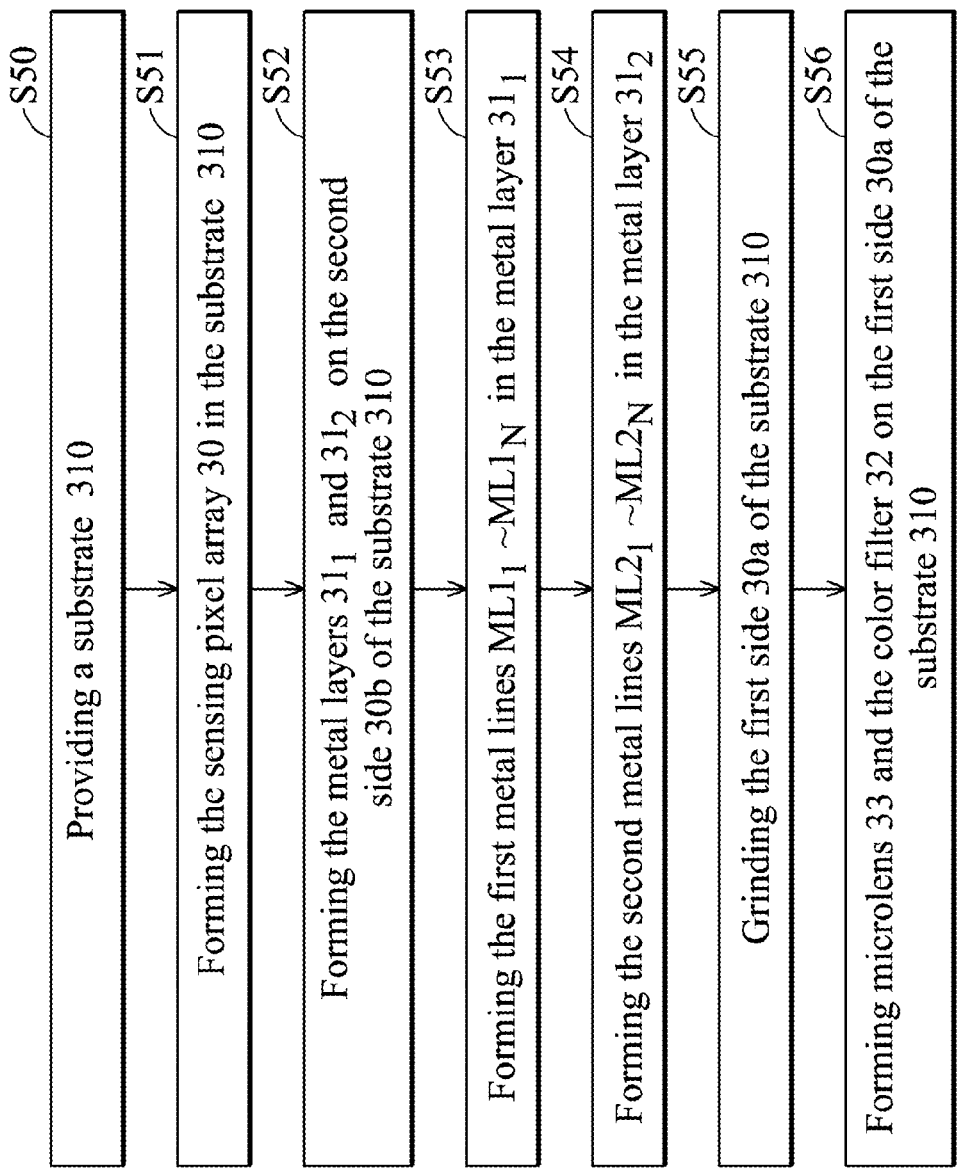
FIG. 5 is a flow chart of an exemplary embodiment of a manufacturing method for a sensing device.

FIG. 5 is a flow chart of an exemplary embodiment of a manufacturing method for a sensing device. In the following, the manufacturing method is described by referring to FIGS. 3-5. In FIG. 5, a substrate 310 is provided (step S50), and the sensing pixel array 30 is formed in the substrate 310 (step S51). The sensing pixel array 30 comprises pixels 300 disposed in rows and columns. The metal layers $31_1$ and $31_2$ are formed on the second side 30b of the substrate 310 (step S52). Then, the first metal lines $ML1_1$~$ML1_M$ are formed in the metal layer $31_1$ (step S53), and the second metal lines $ML2_1$~$ML2_N$ are formed in the metal layer $31_2$ (step S54). The first metal lines $ML1_1$~$ML1_M$ are interlaced with the second metal lines $ML2_1$~$ML2_N$, and each set of the interlaced first and second metal lines forms a cell of the memory unit 35 for memorization. Data is written into one cell for memorization by connecting a corresponding first metal line in the metal layer $31_1$ to a corresponding second metal line in the metal layer $31_2$ through a via. The row decoding circuit 38 is disposed to select one of the first metal lines $ML1_1$~$ML1_M$ according to the address signal $AS_{ROW}$ to detect the voltage level of the selected first metal line. The column decoding circuit 39 is disposed to select one of the second metal lines $ML2_1$~$ML2_N$ according to the address signal $AS_{COLUMN}$ to detect the voltage level of the selected second metal line. The decision circuit 40 is disposed to determine whether the voltage level of the selected first metal line is equal to the voltage level of the selected second metal line. When the decision circuit 40 determines that the voltage level of the selected first metal line is equal to the voltage level of the selected second metal line, the decision circuit 40 decides that data has been written into the corresponding cell and generates a corresponding value, such as a logic high value "1". When the decision circuit 40 determines that the voltage level of the selected first metal line is not equal to the voltage level of the selected second metal line, the decision circuit 40 decides that data is not written into the corresponding cell and generates a corresponding value, such as a logic low value "0". Then, the first side 30a of the substrate 310 is ground to reduce the thickness of the substrate 310 (step S55). The microlens 33 and the color filter 32 are formed on the first side 30a of the substrate 310(step S56). Accordingly, the sensing pixel array 30 receives the light through the microlens 33 and the color filter 32.

In the step S56, the color filter 32 is formed between the microlens 33 and the substrate 310. In some embodiments, the microlens 33 can be formed between the color filter 32 and the substrate 310.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sensing device comprising:
   a sensing pixel array, formed in a substrate, comprising a plurality of pixels for sensing light, wherein the substrate has a first side and a second side opposite to the first side, and the sensing pixel array receives the light through the first side for sensing the light; and
   a memory unit formed on the second side of the substrate for memorization,
   wherein the memory unit comprises:
   a first metal layer formed on the second side of the substrate;
   a second metal layer formed on the second side of the substrate, wherein the memory unit is formed in the first and second metal layers;
   a plurality of first metal lines formed in the first metal layer; and
   a plurality of second metal lines formed in the second metal layer and interlaced with the first metal lines;
   wherein each set of the interlaced first and second metal lines forms a cell for memorization.

2. The sensing device as claimed in claim 1, wherein, when data has been written into one cell for memorization, the first metal line corresponding to the cell is connected to a corresponding second metal line through a via.

3. The sensing device as claimed in claim 1 further comprising:
   a first decoding circuit for receiving a first address signal and selecting one of the first metal lines once, according to the first address signal, to detect a voltage level of the selected first metal line;
   a second decoding circuit for receiving a second address signal and selecting one of the second metal lines, according to the second address signal, to detect a voltage level of the selected second metal line; and
   a decision circuit for determining whether the voltage level of the selected first metal line is equal to the voltage level of the selected second metal line;
   wherein when the decision circuit determines that the voltage level of the selected first metal line is equal to the voltage level of the selected second metal line, the decision circuit decides that data has been written into the corresponding cell.

4. The sensing device as claimed in claim 1, wherein the pixels are disposed in rows and columns, and the sensing device further comprises:
   a readout circuit for reading a detection signal which is generated from at least one of the pixels according to the sensed light.

5. The sensing device as claimed in claim 1, wherein the sensing device uses back-side illumination techniques.

6. The sensing device as claimed in claim 1 further comprising:
   a microlens and a color filter formed on the first side of the substrate; and
   wherein the sensing pixel array receives the light through the microlens and the color filter.

7. A manufacturing method for a sensing device comprising:
   providing a substrate;
   forming a sensing pixel array in the substrate, wherein the substrate has a first side and a second side opposite to the first side, and the sensing pixel array receives the light through the first side for sensing the light; and
   forming a memory unit on the second side of the substrate for memorization,
   wherein the step of forming the memory unit comprises:
   forming a first metal layer and a second metal layer on the second side of the substrate:
   forming a plurality of first metal lines in the first metal layer; and
   forming a plurality of second metal lines in the second metal layer;
   wherein the second metal lines are interlaced with the first metal lines, and each set of the interlaced first and second metal lines forms a cell for memorization.

8. The manufacturing method as claimed in claim 7, wherein data is written into one cell for memorization by connecting a corresponding first metal line to a corresponding second metal line through a via.

9. The manufacturing method as claimed in claim 7, wherein the sensing device uses back-side illumination techniques.

10. The manufacturing method as claimed in claim 7 further comprising:
    grinding the first side of the substrate; and
    forming a microlens and a color filter on the first side of the substrate;
    wherein the sensing pixel array receives the light through the microlens and the color filter.

11. The manufacturing method as claimed in claim 10, wherein the color filter is formed between the microlens and the substrate.

12. The manufacturing method as claimed in claim 10, wherein the microlens is formed between the color filter and the substrate.

* * * * *